US006466100B2

(12) United States Patent
Mullgrav, Jr. et al.

(10) Patent No.: US 6,466,100 B2
(45) Date of Patent: Oct. 15, 2002

(54) LINEAR VOLTAGE CONTROLLED OSCILLATOR TRANSCONDUCTOR WITH GAIN COMPENSATION

(75) Inventors: Allan L. Mullgrav, Jr., Wappingers Falls; Michael A. Sorna, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,107

(22) Filed: Jan. 8, 2001

(65) Prior Publication Data

US 2002/0089381 A1 Jul. 11, 2002

(51) Int. Cl.[7] .......................... H03B 5/24; H03L 7/093; H03L 7/099
(52) U.S. Cl. .............................. 331/179; 331/8; 331/17; 331/34; 331/57; 327/156
(58) Field of Search .............................. 331/1 A, 8, 10, 331/57, 17, 179, 25, 34; 327/156–159; 360/51; 375/376; 455/260

(56) References Cited

U.S. PATENT DOCUMENTS

| 5,061,907 A | | 10/1991 | Rasmussen | |
|---|---|---|---|---|
| 5,382,922 A | | 1/1995 | Gersbach et al. | |
| 5,422,911 A | * | 6/1995 | Barrett, Jr. et al. | ......... 375/327 |
| 5,495,512 A | * | 2/1996 | Kovacs et al. | .............. 375/376 |
| 5,933,031 A | | 8/1999 | Konno | |
| 5,933,037 A | | 8/1999 | Momtaz | |
| 5,973,572 A | | 10/1999 | Ukita | |
| 5,982,213 A | | 11/1999 | Schenck et al. | |
| 6,028,727 A | * | 2/2000 | Vishakhadatta et al. | ...... 360/51 |
| 6,084,480 A | | 7/2000 | Uneme | |
| 6,266,200 B1 | * | 7/2001 | Hase et al. | ................... 360/51 |

* cited by examiner

Primary Examiner—David Mis
(74) Attorney, Agent, or Firm—DeLio & Peterson, LLC; H. Daniel Schnurmann

(57) ABSTRACT

A voltage controlled oscillator of a phase locked loop circuit having digitally controlled gain compensation. The digital control circuitry provides binary logic input to the voltage controlled oscillator for a digitally controlled variable resistance circuit, a digitally controlled variable current transconductor circuit, or differential transistor pairs having mirrored circuitry for adjusting the V-I gain. The latter configuration requires the voltage controlled oscillator to incorporate a source-coupled differential pair which is driven by a low pass filter capacitor output voltage, and connected to load transistors; a current source and a current mirror for generating a tail current; individual banks of transistors to mirror the load transistor currents; a digital-to-analog converter with control lines outputted there from, the digital-to-analog converter used to increase the amount of current allowed to flow to the transconductor output, the current being digitally increased and decreased corresponding to an amount of current pulled from the current source, and mirroring the current through at least one transistor mirror circuit.

19 Claims, 5 Drawing Sheets

LINEAR VOLTAGE CONTROLLED OSCILLATOR TRANSCONDUCTOR WITH GAIN COMPENSATION

BACKGROUND OF THE INVENTION

1. Field of the Invention

The present invention relates generally to a phase locked loop (PLL) circuit, and more particularly, to a circuit for digitally controlling the voltage controlled oscillator (VCO) gain and minimizing variations in the gain due to manufacturing process tolerances.

2. Description of Related Art

A phase locked loop circuit outputs a signal synchronized with an input signal. Essentially, it produces an output signal which tracks an input signal in frequency and exhibits a fixed phase relationship to the input signal. FIG. 1 depicts a conventional PLL circuit 10 which is generally comprised of a phase/frequency detector 12, a charge pump and low pass filter 14, a voltage controlled oscillator 16, and if necessary, a frequency divider 18. If the clock frequency input to the phase detector and the output frequency of the voltage controlled oscillator are equal, the frequency divider 18 is not required.

The phase detector 12 is a device which detects the difference in phase between two input signals, and produces an output signal 20 proportional to the amount of the phase difference. In a PLL, the two inputs to the phase detector 12 are the input to the phase locked loop or frequency reference-in signal 22 and the output signal of the voltage controlled oscillator, i.e., the feedback or frequency-out signal 24. The charge pump produces a control voltage based on the output signal of the phase detector and outputs the control voltage to the low pass filter. The charge pump charges and discharges a capacitor in the low pass filter, depending upon the advanced/delayed phase signal. The low pass filter then eliminates the high frequency components and noise of the output voltage signal that corresponds to the phase difference. The low pass filter smoothes the phase difference signal to convert the same to an error or control voltage 26 which is supplied to the VCO 16 to control the oscillation frequency. This low pass filter output signal 26 is then fed into the voltage controlled oscillator 16. The VCO is the most critical component of a phase locked loop system. A common implementation of a VCO consists of a transconductor 28 and ring oscillator 30. The transconductor 28 converts the input voltage signal 26 into a proportional current signal 29 for input into the ring oscillator 30. Importantly, a gain Kvco is associated with this voltage-current (V-I) conversion. The output frequency dependence on the control voltage is determined by this conversion gain Kvco of the VCO. In some instances, the center frequency of the ring oscillator 30 may be modified by an external current control or by logic or digital input. Digital control circuitry 38 is shown as a means of controlling the ring oscillator center frequency.

Because the PLL is a negative feedback loop, it functions to minimize the phase difference between the oscillation signal 24 and the reference signal 22. When the PLL circuit reaches the lock-in point, the phases of the two signals match with one another, i.e., the oscillation phase and frequency of the VCO output signal 24 become the same as the phase and frequency of the reference signal 22.

Maintaining a low VCO gain is one method of reducing the noise sensitivity of the circuit. With a well controlled gain, the loop filtering schemes become predictable and stable. The gain Kvco, however, may also vary significantly with process, temperature, and power supply variations. Similarly, component tolerances and process variations also affect the range of the center frequency settings at the voltage controlled oscillator output. Typically, center frequency adjustments have been implemented as the way to accommodate these tolerances and variations.

It remains common practice to adjust the center frequency of a VCO for component or process variations by either trimming or electronically adjusting the circuit parameters. In one method of center frequency adjustment, the tail current of the VCO is increased in steps until the desired center frequency is reached and the PLL locks. The number of steps required to reach the center frequency is an indicator of the speed of the process. As noted, however, the gain of a VCO may also vary widely with process, and if left uncontrolled, may affect the stability and noise of the PLL circuit even with a center frequency adjustment.

Bearing in mind the problems and deficiencies of the prior art, it is therefore an object of the present invention to compensate the gain of a linear transconductor of a voltage controlled oscillator.

It is another object of the present invention to control VCO gain tightly and at a lower value.

A further object of the present invention is to ensure that a PLL circuit and its associated VCO are less susceptible to noise.

Yet another object of the present invention is to achieve digital gain control of a VCO without varying components.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a voltage controlled oscillator with digital control comprising: a multistage current controlled oscillator responsive to a control current signal, and outputting a voltage signal having variable frequency; a transconductor for use as a voltage-to-current converter having a predetermined gain, the transconductor responsive to an input voltage signal, converting the input voltage signal to the control current signal as a transconductor output with the predetermined gain, the gain adjustable by digital control circuitry; and, the digital control circuitry responsive to digital logic inputs, having control signal inputs to the transconductor, and adapted to control the gain.

The voltage controlled oscillator includes a current controlled oscillator comprising a ring oscillator. The voltage signal having variable frequency is further comprised of a differential transistor output; the input voltage signal is comprised of a differential transistor pair. The digital control circuitry is adapted to output directly to the transconductor, and to adjust and control a center frequency of the current controlled oscillator. The digital control circuitry further comprises a digitally controlled variable resistance circuit. Input to the digitally controlled variable resistance circuit comprises a digital-to-analog converter output such that the variable resistance is modified by the digital-to-analog converter output. The voltage controlled oscillator further includes the variable resistors being adjusted according to changes in process, such that slower processes requiring more of the gain can be accommodated by an increase in the variable resistance, and faster processes requiring less of the gain can be accommodated by a decrease in the variable resistance.

In a second aspect, the present invention is directed to a voltage controlled oscillator with digital control comprising: a multistage current controlled oscillator responsive to a control current signal, and outputting a voltage signal having variable frequency; a transconductor for use as a voltage-to-current converter having a predetermined gain, the transconductor responsive to an input voltage signal, converting the input voltage signal to the control current signal as a transconductor output with the predetermined gain, the gain adjustable by digital control circuitry; and, the digital control circuitry comprising a digitally controlled variable current transconductor circuit responsive to digital logic inputs, having control signal inputs to the transconductor, and adapted to control the gain.

The voltage controlled oscillator further comprises a differential transistor pair responsive to receiving the differential voltage input from the low pass filter. The VCO includes fixed resistors electrically connected to the differential transistor pair and to a power supply line of the voltage controlled oscillator, and a voltage level shifter. The voltage level shifter comprises a transistor circuit having an input connected to the fixed resistors, and an output connected to a PFET differential pair. The PFET differential pair drives the transconductor output and directly controls the gain. The VCO may further comprise a digital-to-analog converter for establishing a binary weighted amount of current for the PFET differential pair.

In a third aspect, the present invention is directed to a voltage controlled oscillator with digital control comprising: a multistage current controlled oscillator responsive to a control current signal, and outputting a voltage signal having variable frequency; a transconductor for use as a voltage-to-current converter having a predetermined gain, the transconductor having an input transistor circuit including a source-coupled differential pair having a tail current, responsive to an input voltage signal, converting the input voltage signal to the control current signal as a transconductor output with the predetermined gain, the gain adjustable by digital control circuitry; and, the digital control circuitry responsive to digital logic inputs, having control signal inputs to the transconductor, and adapted to control the gain. The source-coupled differential pair is driven by a low pass filter capacitor output voltage, and connected to load transistors. The voltage controlled oscillator may further comprise a current source and a current mirror for generating the tail current. The currents to the load transistors are responsive to a change in the low pass filter capacitor output voltage, and mirrored to individual banks of transistors. The amount of current allowed to flow to the transconductor output is determined by setting a digital-to-analog converter.

In a fourth aspect, the present invention is directed to a phase locked loop circuit comprising: a phase/frequency detector for detecting a phase difference between an oscillation signal from a voltage controlled oscillator and a reference signal; a charge pump and low pass filter circuit for receiving an output signal from the phase/frequency detector, removing high frequency components from the phase/frequency detector output signal, and outputting a control voltage signal to the voltage controlled oscillator; the voltage controlled oscillator comprising: a multistage current controlled oscillator responsive to a control current signal, and outputting a voltage signal having variable frequency; a transconductor for use as a voltage-to-current converter having a predetermined gain, the transconductor responsive to the control voltage signal, converting the control voltage signal to the control current signal as a transconductor output with the predetermined gain, the gain adjustable by digital control circuitry; and, the digital control circuitry responsive to digital logic inputs, having control signal inputs to the transconductor, and adapted to control the gain.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
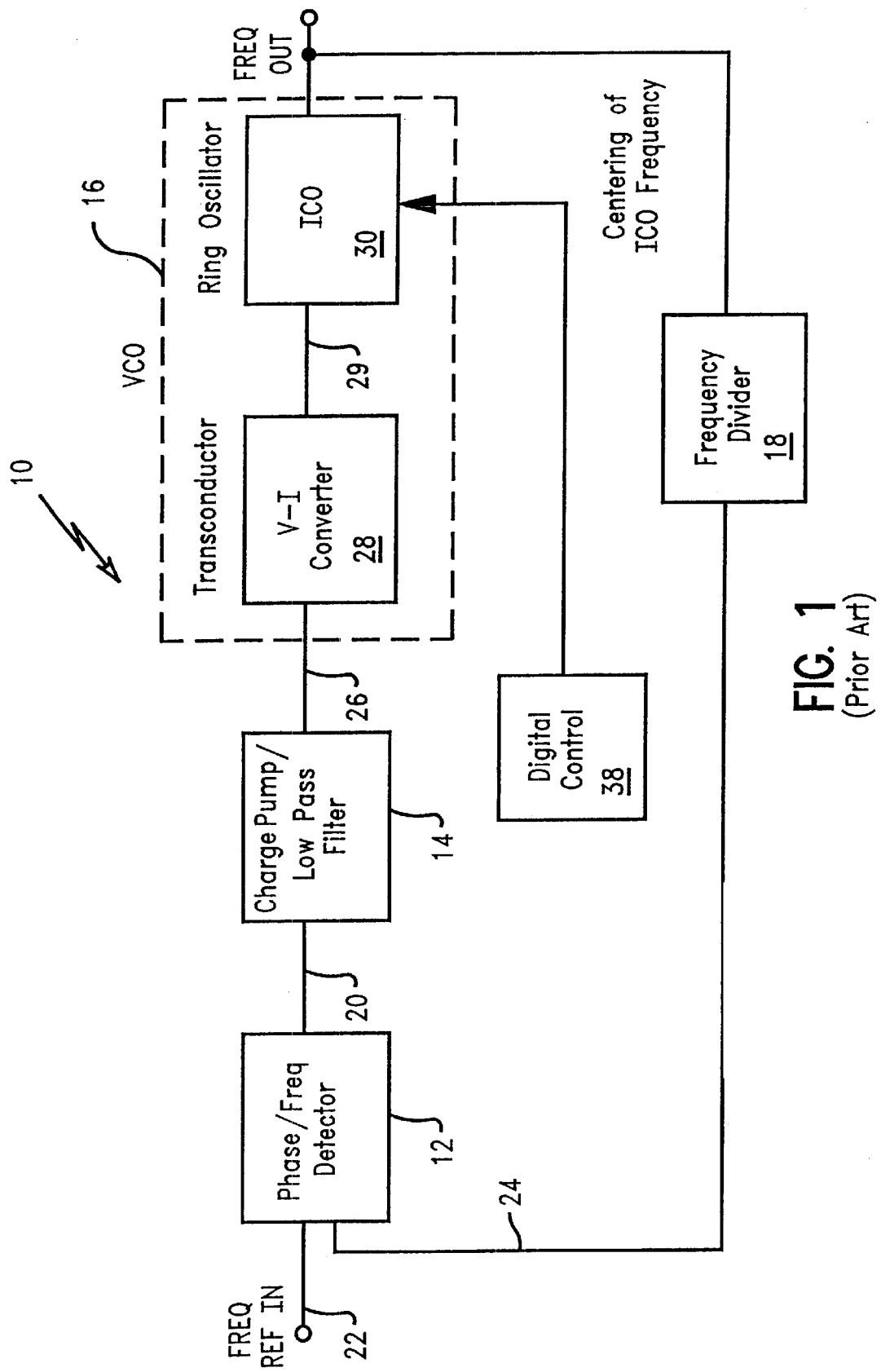
FIG. 1 is a block diagram of a prior art phase lock loop circuit.

In describing the preferred embodiment of the present invention, reference will be made herein to FIGS. 1–5 of the drawings in which like numerals refer to like features of the invention. Features of the invention are not necessarily shown to scale in the drawings.

The input to most VCOs is a voltage-to-current (V-I) converter, known as a transconductor, which changes the control voltage of the filter capacitor to a control current that varies the VCO frequency. Importantly, the gain of the circuit can be modified by changing the gain of the transconductor.

In accordance with the present invention, a phase lock loop circuit having a voltage controlled oscillator gain digitally controlled is introduced, comprising a phase detector, a charge pump and low pass filter, a voltage controlled oscillator, and digital control circuitry for gain adjustment to the V-I converter of the voltage controlled oscillator.

Figure 2:
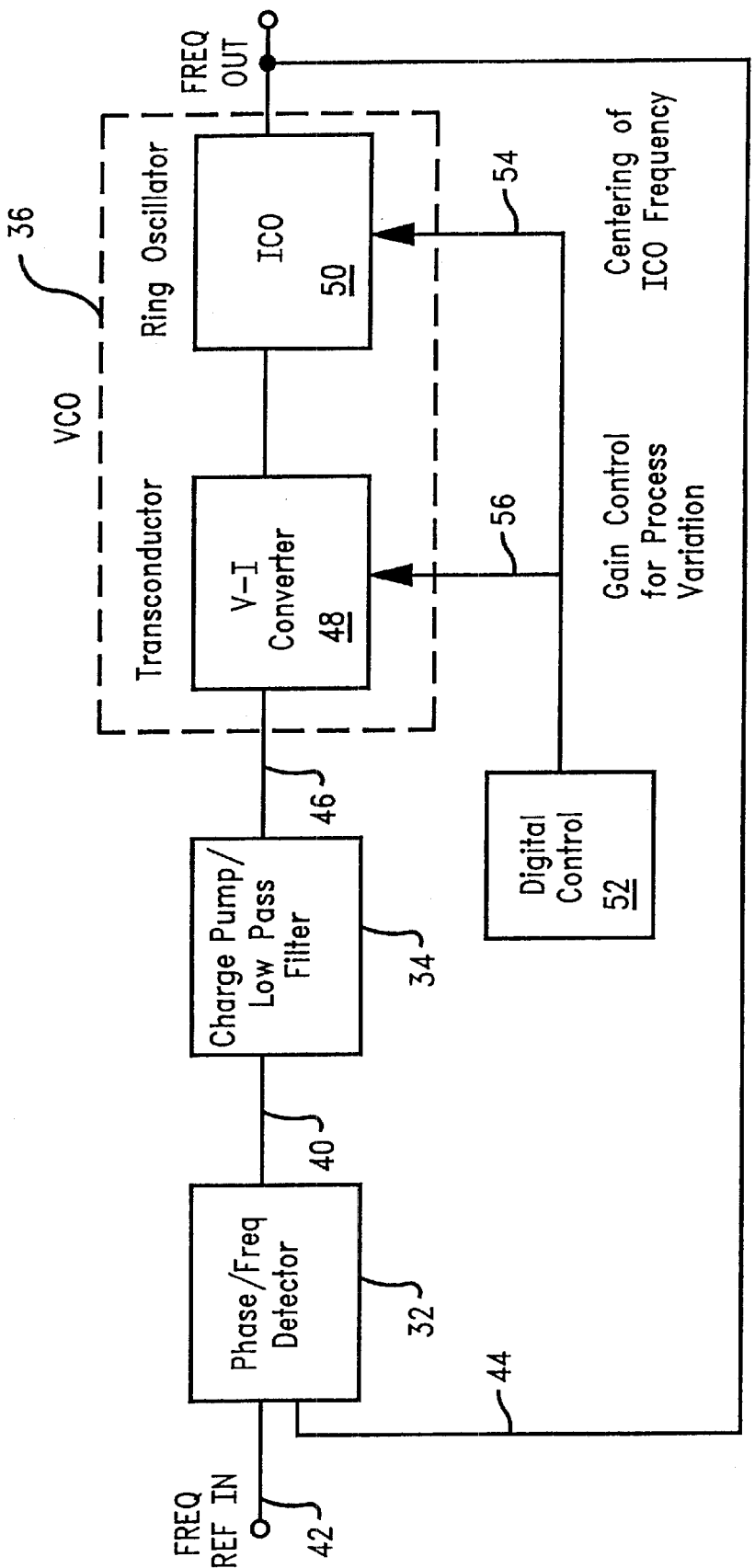
FIG. 2 is a block diagram of the PLL circuit of the instant invention.

FIG. 2 represents a block diagram of the present invention. A frequency reference signal 42 is one input to the phase/frequency detector 32. The second input to phase detector 42 is the output signal 44 of the voltage controlled oscillator 36. Output signal 44 represents the feedback signal for the PLL circuit. The phase detector outputs a signal 40 proportional to the phase difference between the two input signals 42, 44. This phase detector output signal 40 is received by the charge pump and low pass filter circuitry 34. The control voltage signal produced by the charge pump is fed to the low pass filter where high frequency noise components are eliminated. The filtered phase difference signal is converted to a voltage signal 46 which is then passed to the voltage controlled oscillator circuit 36. The VCO consists of a transconductor (V-I converter) 48 and a ring oscillator (current controlled oscillator) 50. Transconductor 48 converts the input voltage signal 46 into a proportional current signal for input into the ring oscillator 50. The gain Kvco associated with this voltage-current (V-I) conversion is digitally controlled by digital control circuitry 52. Digital control circuitry 52 outputs directly to the V-I converter 48 through control signal(s) 56. The digital control signals may also control and adjust the center frequency by accessing the ring oscillator 36 through signal(s) 54. The present invention is directly related to the digital control of the V-I converter gain for mitigating process variation, separate and distinct from the digital controlling of the ring oscillator's center frequency.

Figure 3:
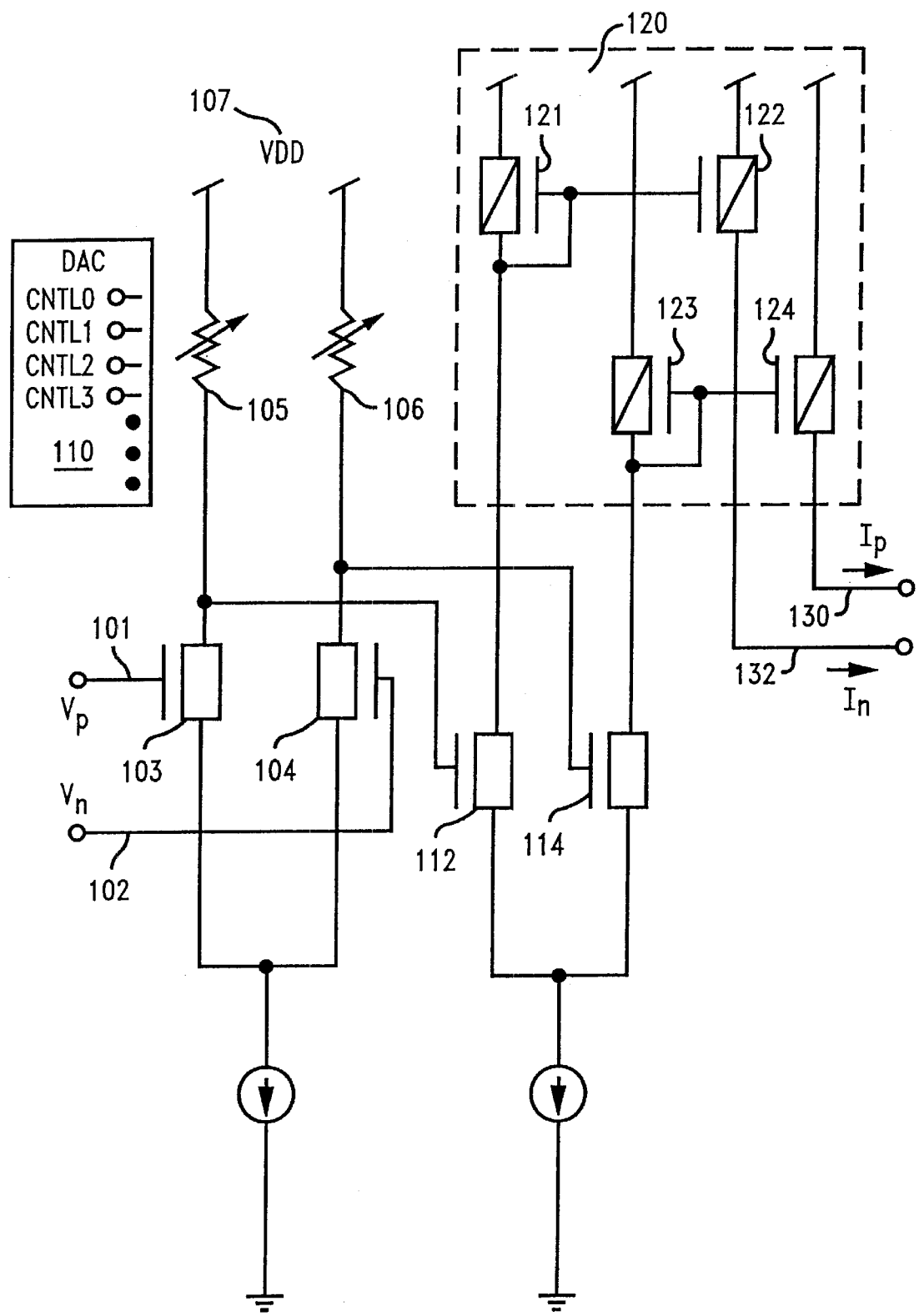
FIG. 3 is an electrical schematic of a digitally controlled variable resistance transconductor.

FIG. 3 represents the first embodiment of the present invention, a digitally controlled variable resistance transconductor. In this embodiment, a digitally controlled variable resistance is used to regulate and control the transconductor gain. The differential voltage input from the low pass filter, Vp 101 and Vn 102, respectively, are received by an NFET differential pair 103, 104. The analog converter (DAC) 110 controls the current through variable resistors 105 and 106 having control lines CNTL0, CNTL1, CNTL2, CNTL3, and the like, corresponding to each bit activated by the DAC. The control lines increment the variable resistance of resistors 105, 106. By connecting the variable resistors to supply voltage VDD 107, source-coupled NFETS 103 and 104, and constant current source 108, a digitally controlled differential amplifier 109 is formed. NFETS 112 and 114 and current source 115 form a second differential amplifier which converts the voltages at 105 and 106 to currents through PFETS 121 and 123. A bank of PFETs 120 is used as a current mirror shown as transistors 121, 122, 123 and 124. Outputs to the ring oscillator, Ip 130 and In 132, originate from the PFET current mirror. The variable resistors 105, 106 are adjusted according to changes in the manufacturing process. For example, a slower process will require more V-I gain, which can be accommodated by an increase in resistance. In contrast, a faster process will require less V-I gain which is accomplished by a decrease in resistance. By digitally controlling and varying the resistance in this circuit, the V-I gain of the transconductor is incrementally adjusted as an input to the ring oscillator circuitry.

Figure 4:
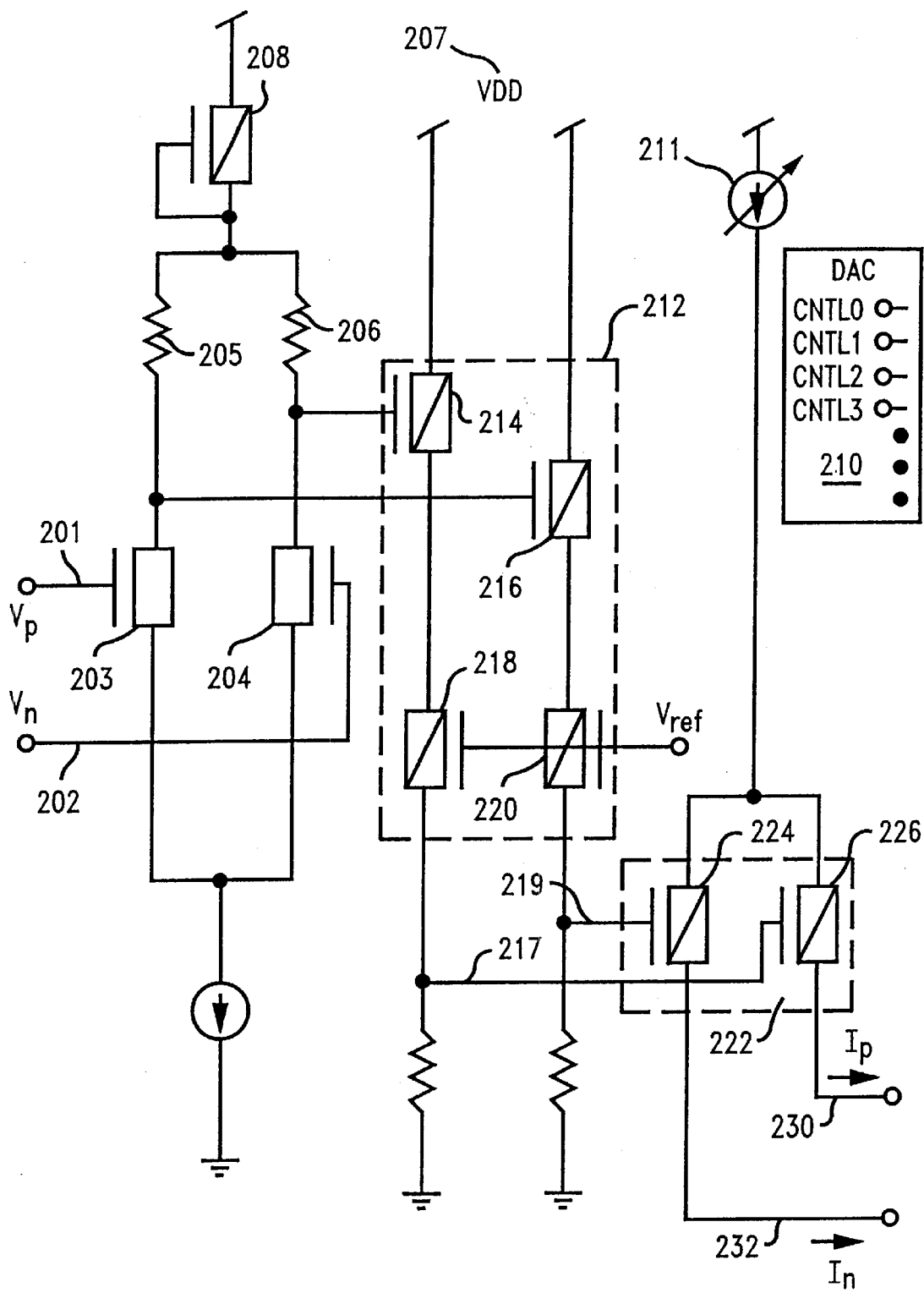
FIG. 4 is an electrical schematic of a digitally controlled variable current transconductor.

A second embodiment for the digitally controlled gain circuitry is depicted in FIG. 4. This embodiment represents a variable current transconductor that reduces the chip area required to implement the design of the first embodiment. In a similar manner to the first embodiment, a differential voltage input from the low pass filter, $V_p$ 201 and $V_n$ 202, respectively, is received by an NFET differential pair 203, 204. Fixed resistors 205, 206 are tied to the NFET differential pair. These fixed resistors are in place of the variable resistors of the first embodiment, thus decreasing the chip area necessary to accommodate this circuit design. The fixed resistors 205, 206 are connected to power supply $V_{DD}$ 207 through PFET 208. A voltage level shifter 212 is introduced, connecting PFETs 214, 216 to the fixed resistors, and PFETs 218, 220 to the transconductor output circuitry. The voltage level shifter circuitry shifts the voltage down in order to drive the PFET gain. The voltage level shifter 212 outputs 217, 219 are connected to a PFET differential pair 222, having PFETs 224 and 226. This differential pair 222 drives the V-I transconductor outputs $I_p$ 230 and $I_n$ 232. By this design, the output currents $I_p$ and $I_n$ are driven without the need for current mirrors, thus increasing the bandwidth of the transconductor. A DAC 210 is used to establish a binary weighted amount of current (variable current) for the PFET differential pair 222. This variable current 211 is adjusted by the activation of control lines CNTL0, CNTL1, CNTL2, CNTL3, and the like. The variable current drives the PFET differential pair 222, which directly controls the transconductor gain. Consequently, in this embodiment, the transconductor gain is controllable by digital means within the VCO, and prior to the ring oscillator stage.

Figure 5:
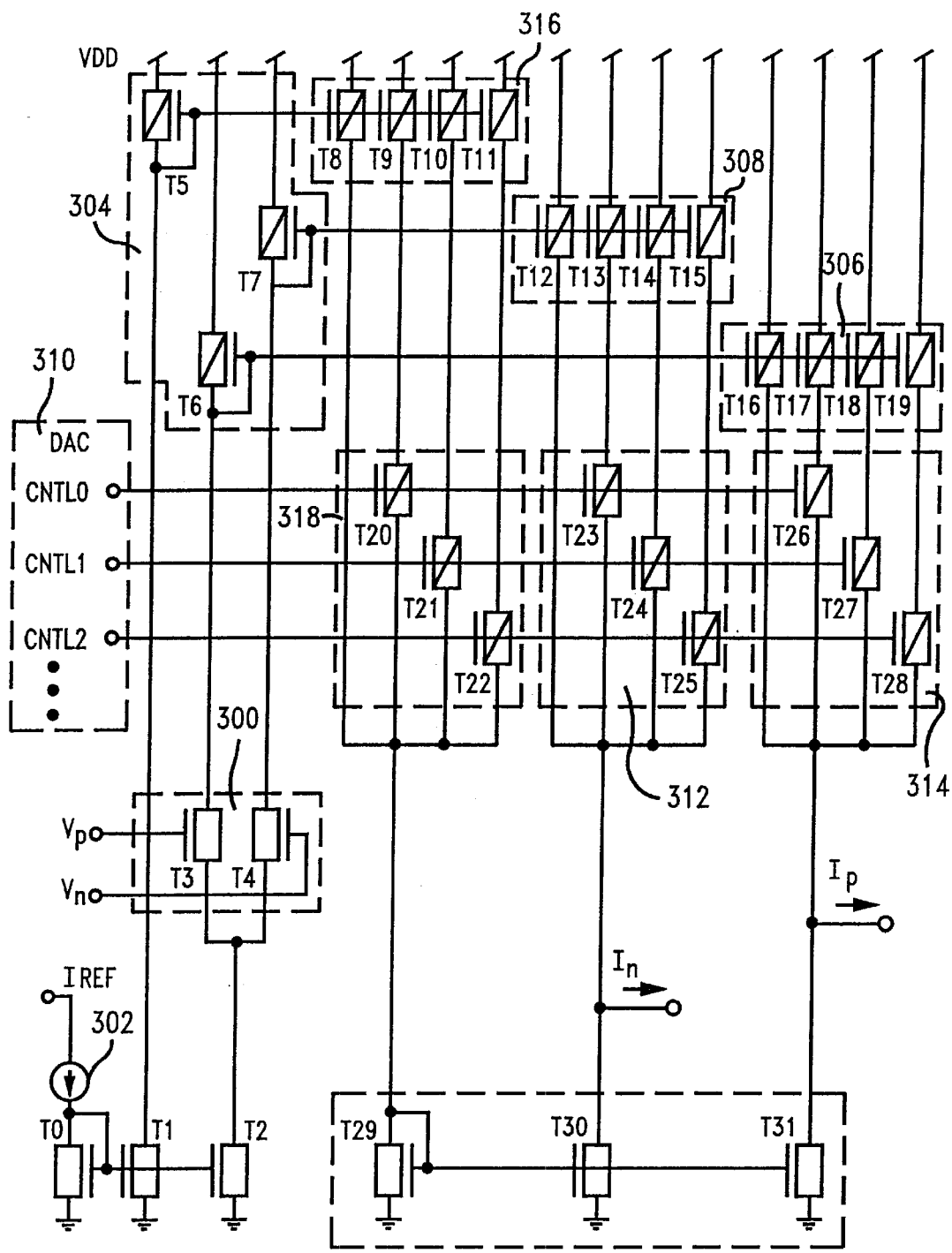
FIG. 5 is an electrical schematic of a digitally controlled transconductor.

The preferred embodiment is depicted in FIG. 5. This embodiment shows a transconductor with input transistors T3 and T4 comprising a source-coupled differential pair 300 driven by the voltage of the low pass filter capacitor of a PLL circuit at levels $V_p$ and $V_n$. The tail current of differential pair 300 is provided by the current source IREF 302 and a current mirror consisting of transistors T0, T1 and T2. As the input voltage changes, the currents in the load transistor suite 304, primarily transistors T6 and T7, are correspondingly changed. These currents are then mirrored to individual banks of transistors 306, 308 The amount of current allowed to flow to the output is determined by setting the control lines of a digital-to-analog converter DAC 310, depicted as CNTL0, CNTL1, CNTL2, and the like. These control lines operate switches T23, T24, and T25, represented in transistor bank 312, and T26, T27 and T28, represented in transistor bank 314. Digital-to-analog converter (DAC) consists of four blocks 310, 312, 314 and 318, wherein 310 is the digital input providing the setting from the center frequency adjustment. Shown are three input bits or control lines, but more can be used if finer granularity of control is desired. Using input 310, current may be incrementally increased or decreased in transistor banks 312, 314, and 318.

The reference current is mirrored through T1 and T5 to transistor bank 316, encompassing transistors T8, T9, T10, and T11. This provides current to transistor T29 for mirroring to transistors T30 and T31. The currents in this path are controlled by transistor bank 318, comprising transistors T20, T21, and T22. The purpose of transistors T30, T31 is to provide equal but opposite currents such that when the input voltage at $V_p$–$V_n$ is zero, then outputs $I_p$ and $I_n$ are both zero regardless of the control setting of the DAC. This ensures that the transconductor will affect only the VCO gain and not the center frequency, which is an advantage over the embodiment in FIG. 4.

Mirror transistor groups T6, T16, T17, T18, T19 and T7, T12, T13, T14, T15 are identical and can be binary weighted to give a wide range of current control. Mirror transistors T5, T8, T9, T10, T11 must have the same binary weighting as the other two mirrors, however, this mirror need not be identical, as long as the multiplication factor of mirror T29, T30 T31 is such that $I_p$–and $I_n$ are both zero when $V_p$ -$V_n$ 1 is zero, as previously stated.

Importantly, transistor mirror banks 308, 306 are controlled by the DAC control lines to allow for switching of the variable output lines of the mirror banks. Unlike the second embodiment, no voltage level shifting is necessitated in this embodiment. Transistor banks 312, 314, and 318 provide switches to turn on/off corresponding current carrying lines. Through selective digital switching of the transistors responsible for carrying the current, i.e., transistor banks 312, 314, and 318, various levels of current may be screened and selected.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A voltage controlled oscillator with digital control comprising:
    a multistage current controlled oscillator responsive to a control current signal, and outputting a voltage signal having a variable frequency; and a transconductor having a predetermined gain and provided with an input port for receiving an input voltage sign said input port driving a differential transistor pair, said transconductor converting said input voltage signal to said control current signal as a transconductor output with said predetermined gain, said gain being adjusted by digital control circuitry, wherein said digital control circuitry is responsive to digital logic inputs providing control signal inputs to said transconductor, and adapted to control said gain.

2. The voltage controlled oscillator of claim 1 wherein said current controlled oscillator comprises a ring oscillator.

3. The voltage controlled oscillator of claim 1 wherein said voltage signal having variable frequency comprises a differential transistor output.

4. The voltage controlled oscillator of claim 1 wherein said gain comprises a voltage-to-current ratio.

5. The voltage controlled oscillator of claim 1 wherein said digital control circuitry is adapted to output directly to said transconductor, and to adjust and control a center frequency of said current controlled oscillator.

6. The voltage controlled oscillator of claim 1 wherein said digital control circuitry further comprises a digitally controlled variable resistance circuit.

7. The voltage controlled oscillator of claim 6 having said digitally controlled variable resistance circuit with varying resistance responsive to discrete binary input.

8. The voltage controlled oscillator of claim 6 wherein said digitally controlled variable resistance circuit regulates and controls said gain.

9. The voltage controlled oscillator of claim 7 wherein said variable resistance is modified by connecting variable resistors to a supply voltage, establishing two digitally controlled current sources.

10. The voltage controlled oscillator of claim 9 having said variable resistors adjusted according to changes in process, such that slower processes requiring more of said gain can be accommodated by an increase in said variable resistance, and faster processes requiring less of said gain can be accommodated by a decrease in said variable resistance.

11. A voltage controlled oscillator with digital control comprising:
a multistage current control oscillator responsive to a control current signal; and outputting a voltage signal having variable frequency; and
a transconductor having a predetermined gain, provided with an input port for receiving a differential voltage input signal from a low pass filter, said transconductor converting said voltage input to said control current signal as a transconductor output with said predetermined gain, said gain being adjusted by digital control circuitry, said digital control circuitry being responsive to digital logic inputs providing control signal inputs to said transconductor, and adapted to control said gain.

12. The voltage controlled oscillator of claim 11 having said digitally controlled variable current circuit responsive to discrete binary input.

13. The voltage controlled oscillator of claim 11 further comprising a differential transistor pair responsive to receiving said differential voltage input from said low pass filter.

14. The voltage controlled oscillator of claim 13 further comprising fixed resistors electrically connected to said differential transistor pair and to a power supply line of said voltage controlled oscillator.

15. The voltage controlled oscillator of claim 14 further comprising a voltage level shifter.

16. The voltage controlled oscillator of claim 15 wherein said voltage level shifter comprises a transistor circuit having an input connected to said fixed resistors, and an output connected to a PFET differential pair.

17. The voltage controlled oscillator of claim 16 wherein said PFET differential pair drives said transconductor output and directly controls said gain.

18. The voltage controlled oscillator of claim 17 further comprising a digital-to-analog converter for establishing a binary weighted amount of current for said PFET differential pair.

19. The voltage controlled oscillator of claim 18 wherein said binary weighted amount of current is adjusted by the activation of binary logic control lines.

* * * * *